US007000416B2

(12) United States Patent
Hirooka et al.

(10) Patent No.: US 7,000,416 B2
(45) Date of Patent: Feb. 21, 2006

(54) COOLING APPARATUS AND PLASMA PROCESSING APPARATUS HAVING COOLING APPARATUS

(75) Inventors: Takaaki Hirooka, Yamanashi (JP); Masao Furuya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/432,888

(22) PCT Filed: Nov. 29, 2001

(86) PCT No.: PCT/JP01/10430

§ 371 (c)(1),
(2), (4) Date: May 29, 2003

(87) PCT Pub. No.: WO02/44634

PCT Pub. Date: Jun. 6, 2002

(65) Prior Publication Data

US 2004/0068997 A1   Apr. 15, 2004

(30) Foreign Application Priority Data

Nov. 30, 2000   (JP)   ............................... 2000-364339

(51) Int. Cl.
*F25D 23/12*   (2006.01)
*F25B 5/00*   (2006.01)
*F25B 21/02*   (2006.01)
*H05K 7/20*   (2006.01)
*F28D 15/00*   (2006.01)

(52) U.S. Cl. ........................ 62/259.2; 62/117; 62/185; 62/498; 62/434; 62/3.1; 62/3.2; 62/3.7; 219/120; 361/688; 361/689; 165/104.19

(58) Field of Classification Search ............... 62/259.2, 62/434, 117, 498, DIG. 10, 3.1–3.7, 185; 219/120; 165/104.19; 361/688, 689
See application file for complete search history.

(56) References Cited

U.S. PATENT DOCUMENTS 5,153,405 A  *  10/1992  Umeda  .................... 219/86.31

(Continued)

FOREIGN PATENT DOCUMENTS

JP           61-38382           2/1986

(Continued)

*Primary Examiner*—Melvin Jones
*Assistant Examiner*—Filip Zec
(74) *Attorney, Agent, or Firm*—Finnegan, Henderson, Farabow, Garrett & Dunner, LLP (57) ABSTRACT a cooling apparatus 110 comprises a primary refrigerant circulating circuit which allows a primary refrigerant CW1 whose temperature is adjusted by a heat exchanger 138 to circulate through an electrode to adjust a temperature of the electrode, a secondary refrigerant circulating circuit which supplies a secondary refrigerant CW2 to the heat exchanger to adjust the temperature of the primary refrigerant, and a freezing circuit 140 which has a first heat exchanger 141 interposed in the secondary refrigerant circulating circuit and which adjust a temperature of the secondary refrigerant by a tertiary refrigerant. The temperature of the primary refrigerant is adjusted by the secondary refrigerant without adjusting the temperature using the freezing circuit. When a temperature of the primary refrigerant is set higher than that of the secondary refrigerant, the temperature of the primary refrigerant can be adjusted only by the secondary refrigerant. Only when the temperature of the primary refrigerant is set lower than that of the secondary refrigerant, the temperature of the secondary refrigerant is adjusted by the freezing circuit and thus, it is possible to save energy.

14 Claims, 4 Drawing Sheets

U.S. PATENT DOCUMENTS

| | | | |
|---|---|---|---|
| 5,376,213 A * | 12/1994 | Ueda et al. | 156/345.27 |
| 6,148,626 A * | 11/2000 | Iwamoto | 62/180 |
| 6,247,531 B1 * | 6/2001 | Cowans | 165/206 |
| 6,334,311 B1 * | 1/2002 | Kim et al. | 62/3.2 |
| 6,427,462 B1 * | 8/2002 | Suenaga et al. | 62/185 |
| 6,658,861 B1 * | 12/2003 | Ghoshal et al. | 62/3.7 |
| 6,705,095 B1 * | 3/2004 | Thompson et al. | 62/117 |
| 2002/0020189 A1 * | 2/2002 | Namose | |

FOREIGN PATENT DOCUMENTS

| | | |
|---|---|---|
| JP | 05-039988 | 2/1993 |
| JP | 07-201956 | 8/1995 |
| JP | 11-183005 | 7/1999 |
| JP | 11-294927 | 10/1999 |
| JP | 2000-58514 A | 2/2000 |
| JP | 2000-058517 | 2/2000 |

* cited by examiner

| ADJUSTABLE TEMPERATURE | SETTING OF LOWER TEMPERATURE<br>−10°C ~ +60°C | SETTING OF HIGH TEMPERATURE<br>+30°C ~ +100°C |
|---|---|---|
| PRIMARY REFRIGERANT CW1 | COOL LOWER ELECTRODE 106 | COOL LOWER ELECTRODE 106 |
| SECONDARY REFRIGERANT CW2 | COOL PRIMARY REFRIGERANT CW1 | COOL PRIMARY REFRIGERANT CW1 |
| FREEZING CIRCUIT 140 | COOL SECONDARY REFRIGERANT CW2 | NOT OPERATED |

COOLING APPARATUS AND PLASMA PROCESSING APPARATUS HAVING COOLING APPARATUS

BACKGROUND OF THE INVENTION

The present invention relates to a cooling apparatus and a plasma processing apparatus having the cooling apparatus.

DESCRIPTION OF THE RELATED ART

Conventionally, in a producing procedure of a semiconductor device or an LCD substrate, various processing apparatuses such as a plasma etching apparatus are used. For example, a plasma etching apparatus brings predetermined processing gas in a vacuum processing chamber into plasma state, and subjects a substrate such as a semiconductor wafer or a glass substrate placed on a mounting stage to etching processing. At the time of processing, the plasma etching apparatus maintains the substrate at a predetermined temperature in order to restrain a temperature rise of the substrate by the plasma or enhance the aspect ratio of the etching or even up the etching shapes.

Generally, a cooling mechanism provided on a mounting stage manages a temperature of the substrate. The cooling mechanism sends a refrigerant (e.g., Galden: trade name) into a refrigerant circulating passage disposed in the mounting stage, and refrigerant absorbs heat to cool the substrate. A refrigerant in a refrigerant tank whose temperature is adjusted by a freezing circuit is sent into a refrigerant circulating passage by a pump, and the refrigerant returned from the refrigerant circulating passage is adjusted in temperature by the freezing circuit and sent into the refrigerant tank. A temperature of the refrigerant sent into the refrigerant tank or the refrigerant circulating passage from the refrigerant tank is monitored and the temperature is controlled such that the temperature becomes equal to a predetermined value.

When a refrigerant for cooling an electrode of the processing apparatus is adjusted in temperature by the freezing circuit, the freezing circuit is operated in association with the temperature control, and the freezing circuit keeps operating irrespective of whether there is a load as long as a temperature setting is not changed.

In accordance with the processing procedure, a temperature of the substrate is set to a low value (e.g., set in a range of $-10°$ C. to $+60°$ C.) or to a high value (e.g., in a range of $+30°$ C. to $+100°$ C.). When the refrigerant is excessively cooled such as when the temperature is adjusted to a high value after a low value, a temperature is adjusted such that refrigerant cooled by the freezing circuit is again heated by a heater in some cases. In such a case, electricity is consumed twice by the freezing circuit and the heater, which hinders energy-conservation.

SUMMARY OF THE INVENTION

The present invention has been accomplished in view of the above problem of the conventional electrode cooling apparatus of the processing apparatus. It is an object of the invention to provide a new and improved electrode cooling apparatus of a processing apparatus capable of save energy without directly adjusting a temperature of a refrigerant (e.g., Galden: trade name) which cools an electrode of the processing apparatus by the freezing circuit.

To achieve the above object, the present invention provides a cooling apparatus and a plasma processing apparatus having the cooling apparatus comprising a primary refrigerant circulating circuit which allows a primary refrigerant whose temperature is adjusted by a heat exchanger to circulate into an electrode and adjusts a temperature of said electrode, and which has a first check valve for allowing said primary refrigerant to flow into said electrode, a second check valve allowing said primary refrigerant to flow out from said electrode, and a purge valve capable of bringing it into communication with a purge gas path, a secondary refrigerant circulating circuit which supplies a secondary refrigerant to said heat exchanger to adjust a temperature of said primary refrigerant, a freezing circuit through which a tertiary refrigerant circulates said heat exchanger being interposed in said secondary refrigerant circulating circuit, said freezing circuit adjusting a temperature of said secondary refrigerant by said tertiary refrigerant, a temperature detector for detecting temperatures of said primary refrigerant and said secondary refrigerant, and a control system for actuating, only when necessary, said freezing circuit in accordance with a detected temperature value of at least one of said primary refrigerant and said secondary refrigerant.

According to such a structure, a temperature of the primary refrigerant (e.g., Galden: trade name) which cools the electrode of the processing apparatus is adjusted by the secondary refrigerant (e.g., cooling water) without adjusting the temperature using the freezing circuit. Therefore, when a temperature of the primary refrigerant is set higher than that of the secondary refrigerant, the temperature of the primary refrigerant can be adjusted only by the secondary refrigerant. Only when the temperature of the primary refrigerant is set lower than that of the secondary refrigerant, the temperature of the secondary refrigerant is adjusted by the freezing circuit. Therefore, it is possible to save energy remarkably as compared with the conventional technique in which the freezing circuit is always actuated and the temperature is adjusted by the heater. A range of controllable temperature is not changed by variation in environment such as season.

Further, it is preferable that said control system is configured to actuate said freezing circuit when a temperature of said primary refrigerant is set lower than the detected temperature value of said secondary refrigerant. Since it is possible to control the amount of heat of the flow rate of the primary refrigerant or the secondary refrigerant while performing the feed back control such that the temperature follows the target adjusted temperature, it is possible to manage the temperature of the substrate more strictly.

It is preferable that said control system is configured to detect an upstream temperature of said electrode of said primary refrigerant circulating circuit, and adjust a flow rate of said secondary refrigerant which circulates in the secondary refrigerant circulating circuit in accordance with the detected temperature value. Since it is possible to control the amount of heat or the flow rate of the secondary refrigerant or the tertiary refrigerant while performing the feed back control such that the temperature follows the target adjusted temperature, it is possible to manage the temperature of the substrate more strictly.

Further, it is preferable that the primary refrigerant circulating circuit comprises a first check valve which allows the primary refrigerant to flow into the electrode, a second check valve which allows the primary refrigerant to flow out from the electrode, and a purge valve which is connected to a downstream side of the first check valve and which is capable of bringing the primary refrigerant circulating circuit into communication with a purge gas path. At the time of over load of the primary refrigerant, if the primary refrigerant circulating circuit is brought into communication with the purge gas path, it is possible to easily control the flow rate of the primary refrigerant. By removing the primary refrigerant in the primary refrigerant circulating circuit using the purge gas, it is possible to easily perform maintenance of the electrode.

As described above, the present invention is especially effective when the temperature of the primary refrigerant is set higher than that of the secondary refrigerant. That is, when the target adjusted temperature of the electrode is, for example, 30° C. to 100° C., it is possible to adjust the temperature of the primary refrigerant only by the secondary refrigerant, it is unnecessary to actuate the freezing circuit, and it is possible to save energy.

DETAILED DESCRIPTION OF THE PREFERRED EMBODIMENTS

Preferred embodiments of a cooling apparatus and a plasma processing apparatus having the cooling apparatus according to the present invention will be explained in detail with reference to the accompanying drawings below. In the specification and the drawings, constituent elements having substantially the same functions are designated with the same symbols, and redundant explanation will be omitted.

(1) Structure of a Plasma Etching Apparatus 100

Figure 1:
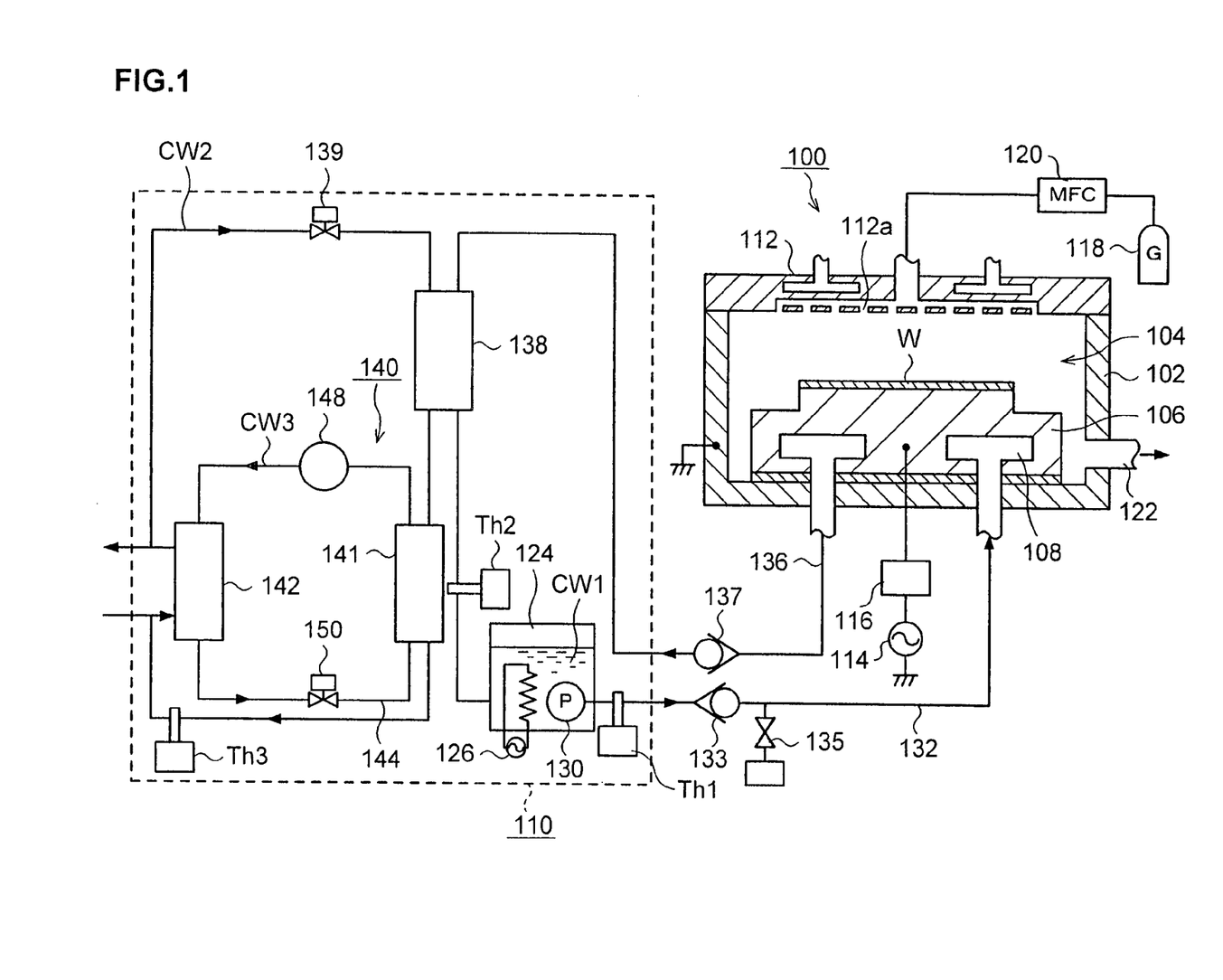
FIG. 1 is a schematic sectional view of an etching apparatus and a cooling apparatus.

First, a plasma etching apparatus 100 will be explained as one example of a processing apparatus with reference to FIG. 1.

A lower electrode 106 on which a semiconductor wafer (simply wafer, hereinafter) W can be placed is disposed in a processing chamber 104 formed in a hermetic processing container 102. Refrigerant circulating passages 108 for cooling the wafer W through the lower electrode 106 to maintain a temperature of the wafer W at a predetermined value are disposed in the lower electrode 106. A cooling apparatus 110 is connected to the cooling circulating passages 108. The cooling apparatus 110 supplies a primary refrigerant (e.g., Galden: trade name) CW1 which is adjusted in temperature into the refrigerant circulating passages 108, and recovers the primary refrigerant CW1 which circulates in the refrigerant circulating passages 108 and again adjusts its temperature. A structure of the cooling apparatus 110 and control of temperature of the primary refrigerant CW1 will be described later.

Upper electrodes 112 which are opposed to a placing surface of the lower electrode 106 are disposed in the processing chamber 104. With such a structure, if high frequency electric power output from a high frequency power supply 114 is applied to the lower electrode 106 through a matching device 116, processing gas which was introduced into the processing chamber 104 from a processing gas supply source G 118 through a flow-rate adjusting valve MFC 120 and a large number of gas discharging holes 112a formed in the upper electrodes 112 is brought into plasma state. With the plasma, the wafer W whose temperature is maintained on the lower electrode 106 is subjected to the etching processing. Gas in the processing chamber 104 is exhausted from an exhausting system 122.

(2) Structure of Cooling Apparatus 110

Next, the structure of the cooling apparatus (simply cooling apparatus, hereinafter) 110 for the lower electrode 106 of the plasma etching apparatus 100 will be explained. The cooling apparatus 110 is roughly divided into three circuits, i.e., a circulating circuit of a primary refrigerant which adjust a temperature of the lower electrode 106, a circulating circuit of a secondary refrigerant which adjusts a temperature of the primary refrigerant, and a freezing circuit (circulating circuit of a tertiary refrigerant) which adjusts a temperature of a secondary refrigerant.

First, the circulating circuit of the primary refrigerant will be explained.

The primary refrigerant (e.g., Galden: trade name) CW1 whose temperature is adjusted is accumulated in a refrigerant tank 124. A heater 126 for adjusting a temperature of the primary refrigerant CW1 is provided in the refrigerant tank 124. The primary refrigerant CW1 in the refrigerant tank 124 is pressurized by a pump 130, and is sent to the refrigerant circulating passage 108 in the lower electrode 106 through a refrigerant supply pipe 132. A first temperature detector Th1 for detecting a temperature of the primary refrigerant CW1 whose temperature is adjusted in the refrigerant tank 124, and a first check valve 133 which allows the primary refrigerant CW1 to flow into the lower electrode 106 from the cooling apparatus 110 are interposed in the refrigerant supply pipe 132.

If a flow rate of the primary refrigerant CW1 flowing through the refrigerant supply pipe 132 is monitored and its value is fed-back to the pump 130 and the pump 130 is controlled in an inverter manner, it is possible to always supply the constant primary refrigerant CW1 to the refrigerant circulating passage 108. It is also possible to give an alarm when the flow rate of the primary refrigerant CW1 is reduced due to leakage of the primary refrigerant CW1 from a joint portion. If an immersion type volute pump which embeds an impeller in the refrigerant tank 124 is used as the pump 130, it becomes unnecessary to seal a driving section (motor) and the reliability can be enhanced.

The first temperature detector Th1 detects a temperature of the primary refrigerant CW1 whose temperature is adjusted in the refrigerant tank 124. A detected temperature value detected by the first temperature detector Th1 is transmitted to a first control system (not shown). The first control system controls the driving operation of a secondary refrigerant circulating circuit which adjust a temperature of the primary refrigerant CW1 in accordance with the detected temperature value detected by the first temperature detector Th1. Since it is possible to control an amount of heat or flow rate of the primary refrigerant CW1 or the secondary refrigerant CW2 while feed-back controlling such that the temperature follows a target adjusted temperature, it is possible to further strictly manage the temperature of the substrate.

The primary refrigerant CW1 which circulated through the refrigerant circulating passage 108 is returned into the cooling apparatus 110 through the refrigerant discharging pipe 136. A second check valve 137 which permits the primary refrigerant CW1 to flow into the cooling apparatus 110 from the lower electrode 106 is interposed in the refrigerant discharging pipe 136. Heat of the primary refrigerant CW1 returned to the cooling apparatus 110 is exchanged with the secondary refrigerant (e.g., cooling water) CW2 by the heat exchanger 138 and then the primary refrigerant CW1 is accumulated in the refrigerant tank 124 again.

It is preferable that a conductive Teflon hose is used as at least a portion of the refrigerant supply pipe 132 or the refrigerant discharging pipe 136 which connects the cooling apparatus 110 and the plasma etching apparatus 100 with each other. That is, insulative Teflon hose, rubber hose, stainless hose and the like are conventionally used as a hose (pipe) for guiding perphloro carbon fluid such as the Galden or Florinate (trade name). However, the insulative Teflon hose has a problem that static electricity is generated by friction between Teflon and the PerFluoro Carbon fluid and a pin hole is adversely formed in the hose. If the rubber hose is used, however, there is a problem that plasticizer is deposited from the hose by the PerFluoro Carbon fluid, the hose is hardened and the hose is pulled off. On the other hand, the stainless hose has a problem that pipe friction coefficient is large. Thereupon, in this embodiment, using a conductive Teflon hose (e.g., R276 produced by Tokatsu Industry Inc.) in which Teflon including carbon is incorporated in a stainless tube, thereby preventing electric charge by friction with respect to the PerFluoro Carbon fluid, and solving the problem that the pin hole is formed in the hose. In this manner, the refrigerant supply pipe 132 and the refrigerant discharging pipe 136 are formed of Teflon having excellent heat insulating coefficient in a high heat-insulation manner and in a flexible manner.

A second temperature detector Th2 for detecting a temperature of the primary refrigerant CW1 after its heat is exchanged with the secondary refrigerant CW2 by the heat exchanger 138 is provided upstream of the refrigerant tank 124. In this manner, the amount of heat or the flow rate of the primary refrigerant CW1 or the secondary refrigerant CW2 can be controlled in a feed-back control manner such that the temperature of the refrigerant follows the target adjusted temperature. Therefore, it is possible to manage the temperature of the substrate more strictly.

A purge valve 135 capable of bringing the refrigerant supply pipe 132 into communication with a purge gas path is provided downstream of the first check valve 133. Air or $N_2$ gas is used as the purge gas. By bringing the refrigerant supply pipe 132 into communication with the purge gas path, purge is carried out by air and $N_2$ gas. With this structure, at the time of over load of the primary refrigerant CW1, it is possible to easily control the flow rate of the primary refrigerant CW1 by bringing the refrigerant supply pipe 132 into communication with the purge gas path. By temporarily removing the primary refrigerant CW1 in the refrigerant supply pipe 132, the refrigerant circulating passage 108 and the refrigerant discharging pipe 136, it is possible to easily perform maintenance of the lower electrode 106.

Figure 2:
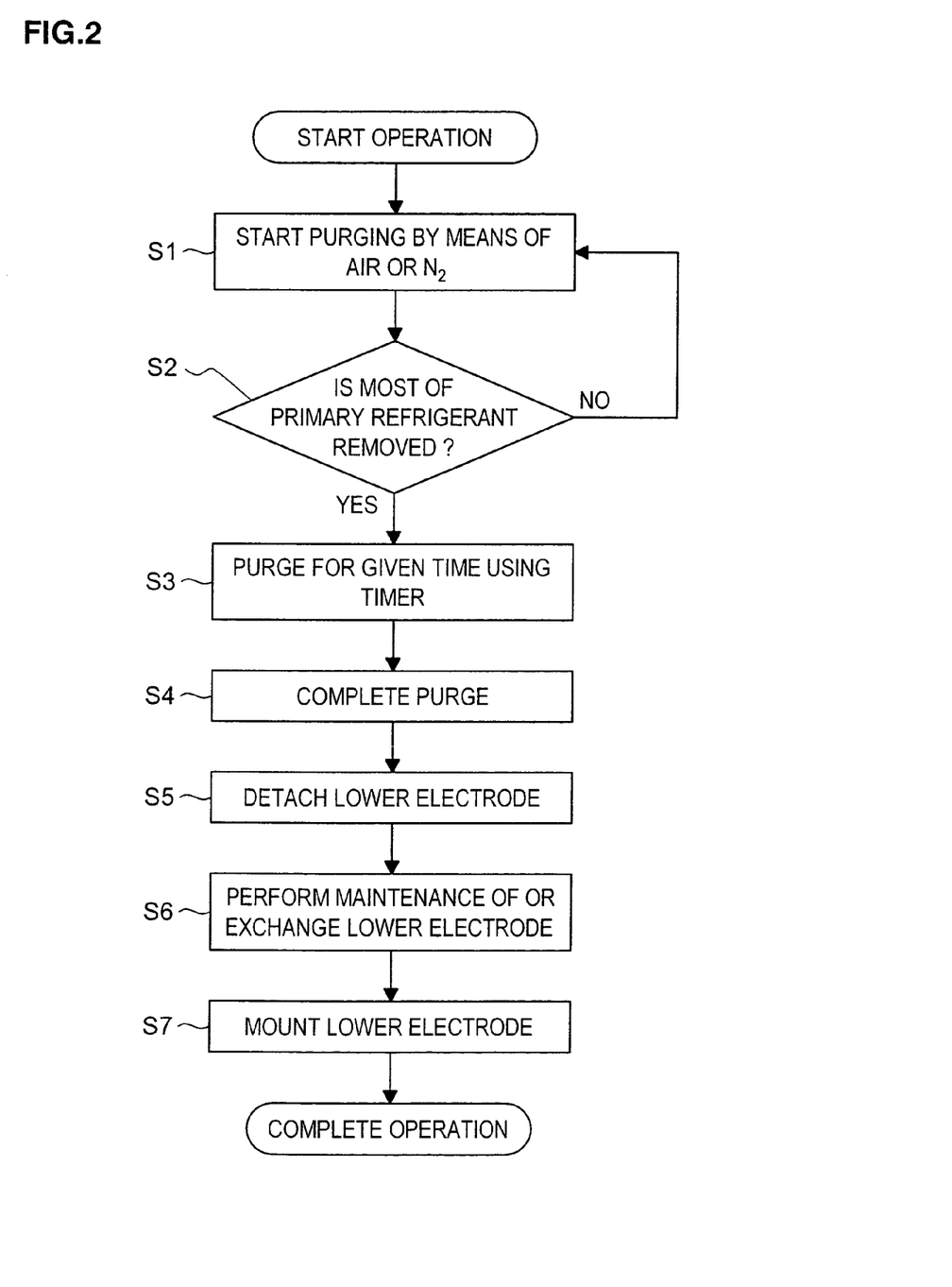
FIG. 2 is a flowchart for explaining temperature control of a refrigerant of the etching apparatus shown in FIG. 1.

FIG. 2 is a flowchart of detaching and attaching operation of the lower electrode 106 at the time of maintenance of the lower electrode 106.

First, the purge valve 135 is opened to bring the refrigerant supply pipe 132 into communication with the purge gas (step S1). It is judged whether most of the primary refrigerant CW1 is removed from the refrigerant supply pipe 132, the refrigerant circulating passage 108 and the refrigerant discharging pipe 136 (step S2). If YES, purge is carried out for a given time using a timer (step S3). With this, it is possible to completely remove the primary refrigerant CW1 is removed from the refrigerant supply pipe 132, the refrigerant circulating passage 108 and the refrigerant discharging pipe 136.

If the primary refrigerant CW1 is completely removed from the primary refrigerant circulation path, the communication between the refrigerant supply pipe 132 with the purge gas is stopped (step S4). Then, the lower electrode 106 is detached from the processing chamber 104 (step S5). Predetermined maintenance (or exchange) of the lower electrode 106 is performed (step S6) and then, the lower electrode 106 is again attached (step S7). In this manner, it is possible to easily perform the maintenance of the lower electrode 106.

One of the features of this embodiment is that the apparatus has the secondary refrigerant circulating circuit which supplies the secondary refrigerant CW2 to the heat exchanger 138 and adjusts a temperature of the primary refrigerant CW1. The circulating circuit of the secondary refrigerant which adjusts the temperature of the primary refrigerant CW1 will be explained below.

The flow rate of the secondary refrigerant (e.g., cooling water) CW2 is controlled by an adjusting valve 139. A heat exchanger 138 and a later-described first heat exchanger (evaporator) 141 in the freezing circuit 140 are interposed downstream of the adjusting valve 139. After heat exchange is performed between the secondary refrigerant CW2 and the primary refrigerant CW1 by the heat exchanger 138, heat exchange between the secondary refrigerant CW2 and the tertiary refrigerant CW3 is further performed by a first heat exchanger 141. A third temperature detector Th3 which detects a temperature of the secondary refrigerant CW2 after the heat exchange with the tertiary refrigerant CW3 is performed by the first heat exchanger 141 is interposed downstream of the first heat exchanger 141.

In the heat exchanger 138, a temperature of the primary refrigerant CW1 is adjusted by the secondary refrigerant CW2. That is, the secondary refrigerant CW2 having a predetermined flow rate which is cooled by the freezing circuit 140 is allowed to circulate in the secondary refrigerant circulating circuit, heat of the primary refrigerant CW1 is absorbed by the secondary refrigerant CW2 when it passes through the heat exchanger 138, and the temperature of the primary refrigerant CW1 is adjusted to the predetermined temperature. The temperature of the primary refrigerant CW1 can appropriately be changed by adjusting the circulating amount of the secondary refrigerant CW2 by the adjusting valve 139 interposed in the secondary refrigerant circulating circuit. If the flow rate of the secondary refrigerant CW2 is increased, the temperature of the primary refrigerant CW1 is reduced, and if the flow rate of the secondary refrigerant CW2 is reduced, the temperature of the primary refrigerant CW1 is increased.

The third temperature detector Th3 detects a temperature of the secondary refrigerant CW2 immediately after its temperature is adjusted by the first heat exchanger 141. The detected temperature value detected by the third temperature detector Th3 is transmitted to a second control system (not shown). The second control system control the drive of the freezing circuit 140 in accordance with the detected temperature value by the third temperature detector Th3. In this manner, the amount of heat or the flow rate of the secondary refrigerant CW2 or the tertiary refrigerant CW3 can be controlled in a feed-back control manner such that the temperature of the refrigerant follows the target adjusted temperature. Therefore, it is possible to manage the temperature of the substrate more strictly.

Next, the freezing circuit (tertiary refrigerant circulating circuit) 140 which adjusts a temperature of the secondary refrigerant CW2 will be explained.

The freezing circuit 140 comprises a first heat exchanger (evaporator) 141 for adjusting a temperature of the secondary refrigerant CW2, a second heat exchanger (condenser) 142, and a heat-exchange path 144 for circulating the tertiary refrigerant (e.g., Freon) CW3 which receives and delivers heat between the first and second heat exchangers 141 and 142 through the first and second heat exchangers 141 and 142. A pump (compressor) 148 and an open/close valve (expansion valve) 150 are interposed in the heat-exchange path 144.

A temperature sensor is provided downstream of the pump 148, a temperature of the tertiary refrigerant CW3 is monitored, thereby finding the contamination of the second heat exchanger 142 and the leakage or excessive cooling of the refrigerant. It is preferable to use a refrigerant having a low GWP (Global Warming Potential) value such as HFC-407C as the tertiary refrigerant CW3.

In the freezing circuit 140 having such a structure, the first heat exchanger 141 is interposed in the secondary refrigerant circulating circuit, and a temperature of the secondary refrigerant CW2 is adjusted by the tertiary refrigerant CW3. That is, the tertiary refrigerant CW3 having a predetermined flow rate which is cooled in the second heat exchanger 142 is allowed to circulate in the heat-exchange path 144 so that the heat of the secondary refrigerant CW2 is absorbed by the tertiary refrigerant CW3 when it passes through the first heat exchanger 141, and the temperature of the secondary refrigerant CW2 is adjusted to the predetermined temperature. The temperature of the secondary refrigerant CW2 can appropriately be changed by adjusting the pumpage of the pump 148. If the flow rate of the tertiary refrigerant CW3 is increased, the temperature of the secondary refrigerant CW2 is reduced, and if the flow rate of the tertiary refrigerant CW3 is reduced, the temperature of the secondary refrigerant CW2 is increased.

Figure 3:
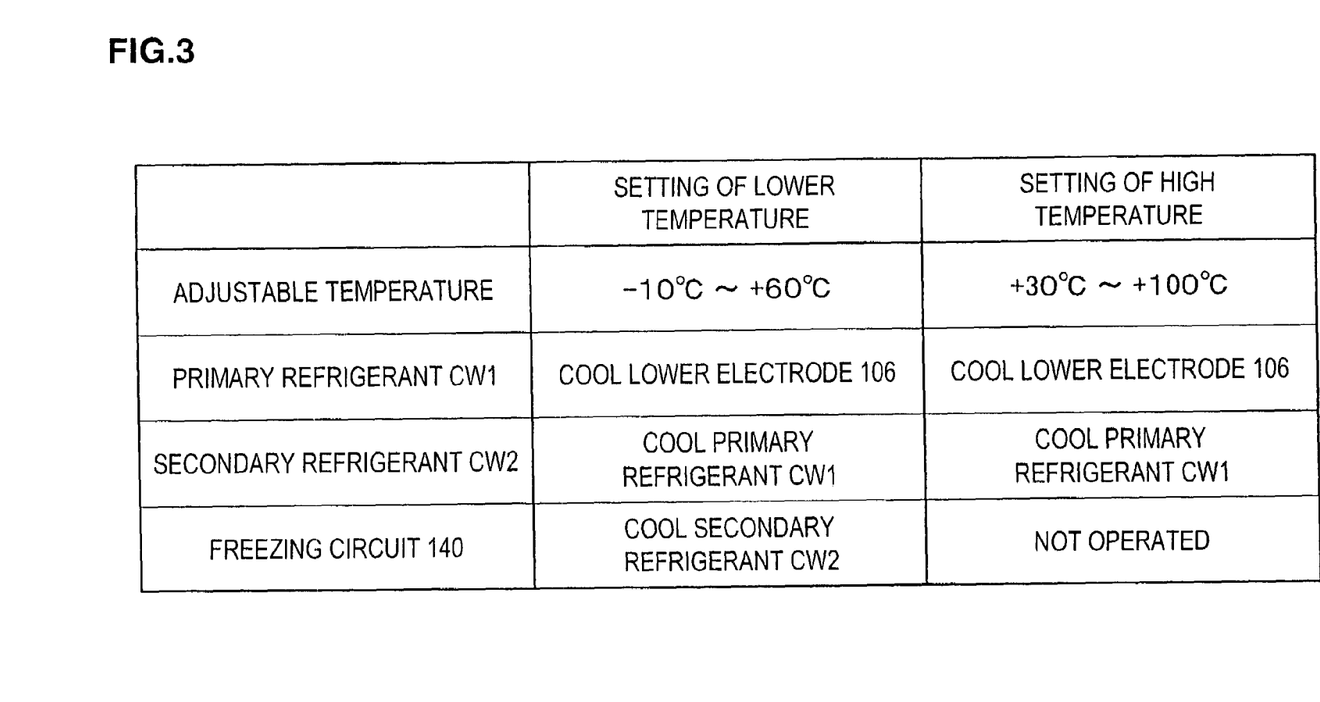
FIG. 3 is a table for collectively explaining adjustable temperatures at the time of low temperature setting and high temperature setting, and operations of a primary refrigerant, a secondary refrigerant and a freezing circuit.

FIG. 3 collectively show the above-described adjustable temperature at the time of low temperature setting and high temperature setting, and operations of the primary refrigerant CW1, the secondary refrigerant CW2 and the freezing circuit 140.

According to the embodiment as explained above, a temperature of the primary refrigerant CW1 which cools the lower electrode 106 is adjusted by the secondary refrigerant CW2 without directly adjusting the temperature by the freezing circuit. Therefore, when the temperature of the primary refrigerant CW1 is set to a value higher than that of the secondary refrigerant CW2, e.g., when the target adjusted temperature of the lower electrode 106 is set to 30° C. to 100° C., it is possible to adjust the temperature of the primary refrigerant CW1 only with the secondary refrigerant CW2. Only when the temperature of the primary refrigerant CW1 is set to a value lower than that of the secondary refrigerant CW2, the temperature of the secondary refrigerant CW2 is adjusted by the freezing circuit 140. Therefore, it is only necessary to actuate the freezing circuit 140 only when it is required, and it is possible to save energy. A range of controllable temperature is not changed by variation in environment such as season.

Further, since the amount of heat or flow rate of the refrigerant is controlled in accordance with the detected temperature value by the temperature detectors Th1 to Th3, it is possible to manage the temperature of the wafer W more strictly.

Further, since the primary refrigerant circulating circuit is provided with the first check valve 133, the second check valve 137 and the purge valve 135, it is possible to easily control the circulation amount of the primary refrigerant CW1 in the primary refrigerant circulating circuit, and it is possible to easily control the primary refrigerant CW1 at the time of over load, and to perform maintenance of the lower electrode 106 easily.

Although the preferred embodiment of a cooling apparatus and a plasma processing apparatus having the cooling apparatus according to the present invention has been explained above with reference to the drawings, the invention is not limited to the embodiment. It is apparent that a person skilled in the art can reach various examples of change of modification within a range of the technical idea described in claims, and it should be understood that there various examples naturally belong to the technical range of present invention.

For example, although a temperature of the primary refrigerant is controlled based on a temperature of the electrode (lower electrode 106) in the above embodiment, the present invention is not limited to such a structure. For example, the temperature of the primary refrigerant may be controlled based on a temperature of the substrate (wafer W).

Figure 4A:
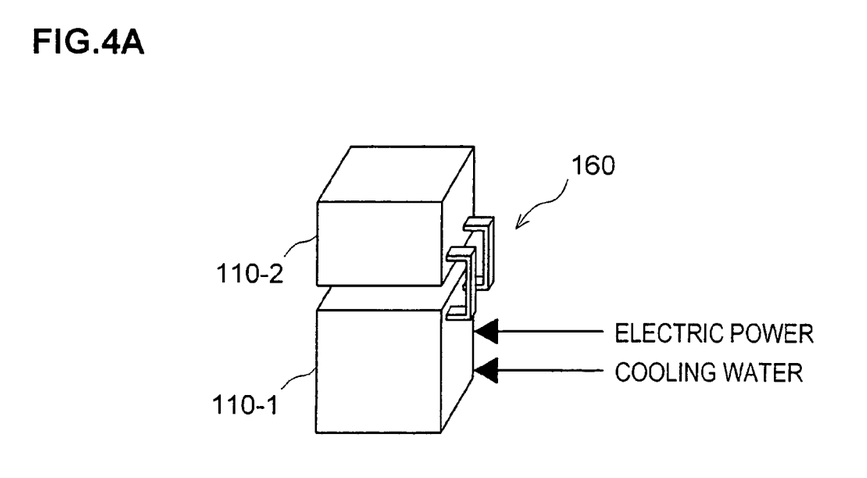
FIG. 4 are diagrams for explaining vertically arranged a plurality of cooling apparatuses.
Figure 4B:
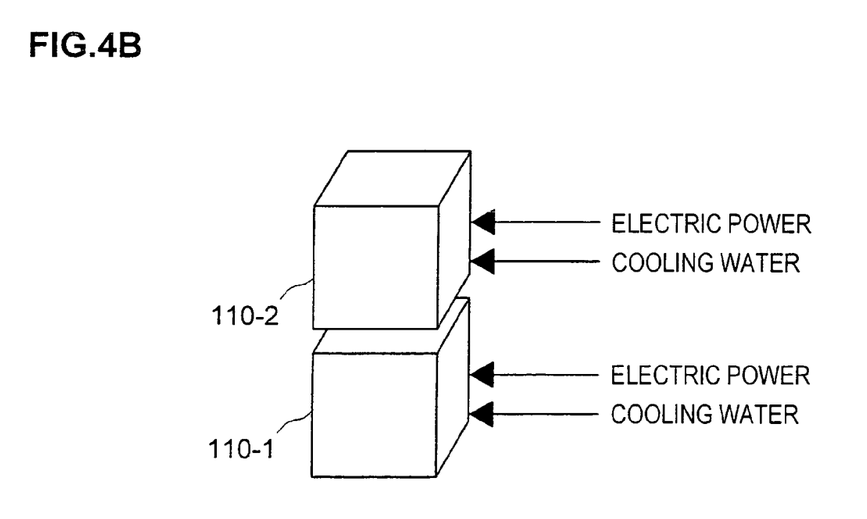

Although the adjustable temperature range of the cooling apparatus is −10° C. to +100° C. in the above embodiment, a plurality of cooling apparatuses having different adjustable temperature ranges may be disposed. In this case, as shown in FIGS. 4A and B, it is preferable to set power (electric power and cooling water) to be supplied to the cooling apparatuses in accordance with the number of processing chambers. That is, if the apparatus has one processing chamber (not shown), as shown in FIG. 4A, one set of system of the power is prepared, and the power is supplied from a lower (low temperature) cooling apparatus 110-1 to an upper (high temperature) cooling apparatus 110-2 through a power supply section 160. If the apparatus has two processing chambers (not shown), as shown in FIG. 4B, if two sets of power system respectively corresponding to the lower cooling apparatus 110-1 and the upper cooling apparatus 110-2 are prepared, it is possible to perform maintenance for each processing chamber, which is convenient. By disposing the cooling apparatuses vertically as shown in FIGS. 4A and B, it is possible to reduce the installing space.

As explained above, according to the present invention, the primary refrigerant (e.g., Galden: trade name) for cooling the electrode of the processing apparatus is adjusted in temperature only by the secondary refrigerant (e.g., cooling water) without adjusting the temperature by the freezing circuit. Therefore, when the temperature of the primary refrigerant is set to a value higher than the secondary refrigerant, the temperature of the primary refrigerant can be adjusted by the secondary refrigerant only. Only when the temperature of the primary refrigerant is set lower than that of the secondary refrigerant, the temperature of the secondary refrigerant is adjusted by the freezing circuit. Therefore, it is possible to save energy remarkably as compared with the conventional technique in which the freezing circuit is always actuated and the temperature is adjusted by the heater. A range of controllable temperature is not changed by variation in environment such as season.

The present invention can be utilized for various processing apparatuses such as plasma etching apparatuses used for producing procedure of the semiconductor device and the LCD substrate.

What is claimed is:

1. A cooling apparatus comprising:
a primary refrigerant circulating circuit which allows a primary refrigerant whose temperature is adjusted by a heat exchanger to circulate into an electrode and adjusts a temperature of said electrode, and which has a first check valve for allowing said primary refrigerant to flow into said electrode, a second check valve allowing said primary refrigerant to flow out from said electrode, and a purge valve capable of bringing said primary refrigerant into communication with a purge gas path,
a secondary refrigerant circulating circuit which supplies a secondary refrigerant to said heat exchanger to adjust a temperature of said primary refrigerant, and
a freezing circuit through which a tertiary refrigerant circulates said heat exchanger being interposed in said secondary refrigerant circulating circuit, said freezing circuit adjusting a temperature of said secondary refrigerant by said tertiary refrigerant, a temperature detector for detecting temperatures of said primary refrigerant and said secondary refrigerant, and a control system for actuating, only when necessary, said freezing circuit in accordance with a detected temperature value of at least one of said primary refrigerant and said secondary refrigerant,
wherein the freezing circuit is configured to not operate when the cooling apparatus is in an energy-saving mode.

2. A cooling apparatus according to claim 1, wherein said control system is configured to actuate said freezing circuit when a temperature of said primary refrigerant is set lower than the detected temperature value of said secondary refrigerant.

3. A cooling apparatus according to claim 1, wherein said control system is configured to detect an upstream temperature of said electrode of said primary refrigerant circulating circuit, and adjust a flow rate of said secondary refrigerant which circulates in the secondary refrigerant circulating circuit in accordance with the detected temperature value.

4. A plasma processing apparatus having a cooling apparatus according to claim 1.

5. A plasma processing apparatus having a cooling apparatus according to claim 2.

6. A plasma processing apparatus having a cooling apparatus according to claim 3.

7. A cooling apparatus according to claim 1, wherein a second control system is configured to prevent the freezing circuit from operating when the cooling apparatus is the energy-saving mode.

8. A plasma processing apparatus having a cooling apparatus according to claim 7.

9. A cooling apparatus comprising:
a primary refrigerant circulating circuit which allows a primary refrigerant whose temperature is adjusted by a heat exchanger to circulate into an electrode and adjusts a temperature of said electrode, and which has a first check valve for allowing said primary refrigerant to flow into said electrode, a second check valve allowing said primary refrigerant to flow out from said electrode, and a purge valve capable of bringing said primary refrigerant into communication with a purge gas path,
a secondary refrigerant circulating circuit which supplies a secondary refrigerant to said heat exchanger to adjust a temperature of said primary refrigerant, and
a freezing circuit through which a tertiary refrigerant circulates said heat exchanger being interposed in said secondary refrigerant circulating circuit, said freezing circuit adjusting a temperature of said secondary refrigerant by said tertiary refrigerant, a temperature detector for detecting temperatures of said primary refrigerant and said secondary refrigerant, and a control system for actuating, only when necessary, said freezing circuit in accordance with a detected temperature value of at least one of said primary refrigerant and said secondary refrigerant,
wherein a second control system is configured to prevent the freezing circuit from operating when the cooling apparatus is an energy-saving mode.

10. A cooling apparatus according to claim 9, wherein said control system is configured to actuate said freezing circuit when a temperature of said primary refrigerant is set lower than the detected temperature value of said secondary refrigerant.

11. A cooling apparatus according to claim 9, wherein said control system is configured to detect an upstream temperature of said electrode of said primary refrigerant circulating circuit, and adjust a flow rate of said secondary refrigerant which circulates in the secondary refrigerant circulating circuit in accordance with the detected temperature value.

12. A plasma processing apparatus having a cooling apparatus according to claim 9.

13. A plasma processing apparatus having a cooling apparatus according to claim 10.

14. A plasma processing apparatus having a cooling apparatus according to claim 11.

* * * * *